(12) United States Patent
Sadhu et al.

(10) Patent No.: US 11,784,628 B2
(45) Date of Patent: *Oct. 10, 2023

(54) BI-POLAR BORDER REGION IN PIEZOELECTRIC DEVICE

(71) Applicant: Qorvo US, Inc., Greensboro, NC (US)

(72) Inventors: Jyothi Swaroop Sadhu, Sanford, FL (US); Ralph Rothemund, Apopka, FL (US); Alireza Tajic, Winter Springs, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/933,958

(22) Filed: Sep. 21, 2022

(65) Prior Publication Data

US 2023/0036920 A1 Feb. 2, 2023

Related U.S. Application Data

(63) Continuation of application No. 16/268,949, filed on Feb. 6, 2019, now Pat. No. 11,509,287.

(Continued)

(51) Int. Cl.
*H03H 9/17* (2006.01)
*H03H 9/02* (2006.01)
(Continued)

(52) U.S. Cl.
CPC ............ *H03H 9/17* (2013.01); *H03H 7/0161* (2013.01); *H03H 9/02007* (2013.01); *H03H 9/54* (2013.01); *H03H 2009/02173* (2013.01)

(58) Field of Classification Search
CPC ........ H03H 9/17; H03H 9/02007; H03H 9/54; H03H 7/0161; H03H 2009/02173
See application file for complete search history.

(56) References Cited

U.S. PATENT DOCUMENTS 8,456,257 B1 6/2013 Fattinger
8,575,820 B2 11/2013 Shirakawa et al.
(Continued)

FOREIGN PATENT DOCUMENTS

JP 2013005446 A 1/2013

OTHER PUBLICATIONS

Fattinger, "Optimization of acoustic dispersion for high performance thin film BAW resonators," IEEE Ultrasonics Symposium, 2005, pp. 1175-1178.

(Continued)

*Primary Examiner* — Samuel S Outten
(74) *Attorney, Agent, or Firm* — Withrow & Terranova, P.L.L.C.

(57) ABSTRACT

An acoustic device includes a foundation structure and a transducer provided over the foundation structure. The foundation structure includes a piezoelectric layer between a top electrode and a bottom electrode. The piezoelectric layer has an active portion within an active region of the transducer, and a bi-polar border portion within a border region of the transducer. The piezoelectric material in the active portion has a first polarization. The bi-polar border portion has a first sub-portion and a second sub-portion, which resides either above or below the first sub-portion. The piezoelectric material in the first sub-portion has the first polarization, and the piezoelectric material in the second sub-portion has a second polarization, which is opposite the first polarization.

20 Claims, 15 Drawing Sheets

Related U.S. Application Data

(60) Provisional application No. 62/779,605, filed on Dec. 14, 2018.

(51) Int. Cl.
*H03H 9/54* (2006.01)
*H03H 7/01* (2006.01)

(56) References Cited

U.S. PATENT DOCUMENTS

| | | | |
|---|---|---|---|
| 11,509,287 B2* | 11/2022 | Sadhu | H03H 9/02157 |
| 2005/0012568 A1 | 1/2005 | Aigner et al. | |
| 2009/0206706 A1 | 8/2009 | Iwaka et al. | |
| 2012/0049976 A1 | 3/2012 | Son et al. | |
| 2012/0218056 A1 | 8/2012 | Burak | |
| 2012/0218058 A1 | 8/2012 | Burak et al. | |
| 2012/0218059 A1 | 8/2012 | Burak et al. | |
| 2014/0176261 A1 | 6/2014 | Burak et al. | |
| 2015/0280687 A1 | 10/2015 | Burak et al. | |
| 2015/0318837 A1 | 11/2015 | Zou et al. | |
| 2015/0349743 A1 | 12/2015 | Burak et al. | |
| 2017/0054430 A1 | 2/2017 | Fattinger et al. | |
| 2017/0263844 A1 | 9/2017 | Tajic et al. | |
| 2017/0288121 A1* | 10/2017 | Burak | H03H 9/02118 |
| 2019/0305755 A1 | 10/2019 | Kreuzer et al. | |
| 2020/0195222 A1 | 6/2020 | Sadhu et al. | |

OTHER PUBLICATIONS

Fattinger, "Spurious mode suppression in coupled resonator filters," Microwave Symposium Digest, Jul. 2005, pp. 409-412.
Katila, J., et al., "Spurious Resonance Free Bulk Acoustic Wave Resonators," International Ultrasonics Symposium, 2003, vol. 1, IEEE, pp. 84-87.
Larson, John, et al., "Characterization of Reversed c-axis AlN thin films," International Ultrasonics Symposium, Oct. 2010, IEEE, pp. 1054-1059.
Park, "Advanced lateral structures of BAW resonators for spurious mode suppression," 42nd European Microwave Conference, Nov. 2012, pp. 104-107.
Thalhammer, Robert et al., "Finite Element Analysis of BAW Devices: Principles and Perspectives," 2015 IEEE International Ultrasonics Symposium Proceedings, Oct. 2015, IEEE, 10 pages.
Thalhammer, Robert et al., "Spurious mode suppression in BAW resonators," 2006 IEEE Ultrasonics Symposium, Oct. 2006, IEEE, pp. 456-459.
Non-Final Office Action for U.S. Appl. No. 15/279,897, dated Oct. 16, 2018, 13 pages.
Final Office Action for U.S. Appl. No. 15/279,897, dated Mar. 5, 2019, 12 pages.
Advisory Action and Applicant-Initiated Interview Summary for U.S. Appl. No. 15/279,897, dated Apr. 29, 2019, 4 pages.
Notice of Allowance for U.S. Appl. No. 15/279,897, dated Jun. 10, 2019, 7 pages.
Final Office Action for U.S. Appl. No. 14/877,324, dated Jun. 16, 2017.
Non-Final Office Action for U.S. Appl. No. 14/877,324, dated Dec. 1, 2016, 8 pages.
Notice of Allowance for U.S. Appl. No. 15/279,897, dated Sep. 19, 2019, 8 pages.
Non-Final Office Action for U.S. Appl. No. 16/268,949, dated Apr. 6, 2022, 15 pages.
Non-Final Office Action for U.S. Appl. No. 16/287,277, dated May 1, 2020, 8 pages.
Final Office Action for U.S. Appl. No. 16/287,277, dated Dec. 11, 2020, 9 pages.
Advisory Action for U.S. Appl. No. 16/287,277, dated Apr. 2, 2021, 3 pages.
Notice of Allowance for U.S. Appl. No. 16/287,277, dated Apr. 19, 2021, 7 pages.
Notice of Reasons for Refusal for Japanese Patent Application No. 2019062612, dated Mar. 15, 2023, 6 pages.

* cited by examiner

BI-POLAR BORDER REGION IN PIEZOELECTRIC DEVICE

RELATED APPLICATIONS

This application is a continuation of U.S. patent application Ser. No. 16/268,949, filed Feb. 6, 2019, now U.S. Pat. No. 11,509,287, which claims the benefit of provisional patent application Ser. No. 62/779,605, filed Dec. 14, 2018, the disclosures of which are hereby incorporated herein by reference in their entireties.

FIELD OF THE DISCLOSURE

The present disclosure relates to piezoelectric devices that employ piezoelectric films and in particular to such devices that have a bi-polar border region.

BACKGROUND

Acoustic resonators, and particularly bulk acoustic wave (BAW) resonators, are used in many high-frequency communication applications. In particular, BAW resonators are often employed in filter networks that operate at frequencies above 1.5 GHz and require a flat passband, have exceptionally steep filter skirts and squared shoulders at the upper and lower ends of the passband, and provide excellent rejection outside of the passband. BAW-based filters also have relatively low insertion loss, tend to decrease in size as the frequency of operation increases, and are relatively stable over wide temperature ranges. As such, BAW-based filters are the filter of choice for many 3rd Generation (3G) and 4th Generation (4G) wireless devices and are destined to dominate filter applications for 5th Generation (5G) wireless devices. Most of these wireless devices support cellular, wireless fidelity (Wi-Fi), Bluetooth, and/or near field communications on the same wireless device and, as such, pose extremely challenging filtering demands. While these demands keep raising the complexity of the wireless devices, there is a constant need to improve the performance of BAW resonators and BAW-based filters and to decrease the cost and size associated therewith.

SUMMARY

An acoustic device includes a foundation structure and a transducer provided over the foundation structure. The foundation structure includes a piezoelectric layer between a top electrode and a bottom electrode. The piezoelectric layer has an active portion within an active region of the transducer and a bi-polar border portion within a border region of the transducer. The piezoelectric material in the active portion has a first polarization. The bi-polar border portion has a first sub-portion and a second sub-portion, which resides either above or below the first sub-portion. The piezoelectric material in the first sub-portion has the first polarization, and the piezoelectric material in the second sub-portion has a second polarization, which is opposite the first polarization.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

Figures 8A, 8B:
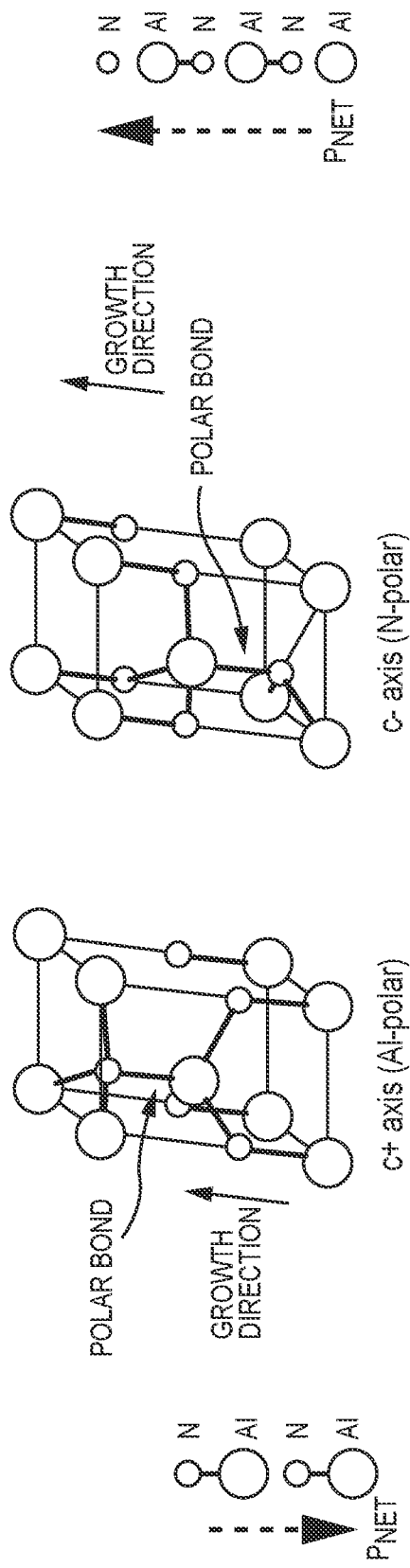

FIGS. 8A and 8B graphically illustrate the different polar orientations of aluminum nitride.

Figure 9A:
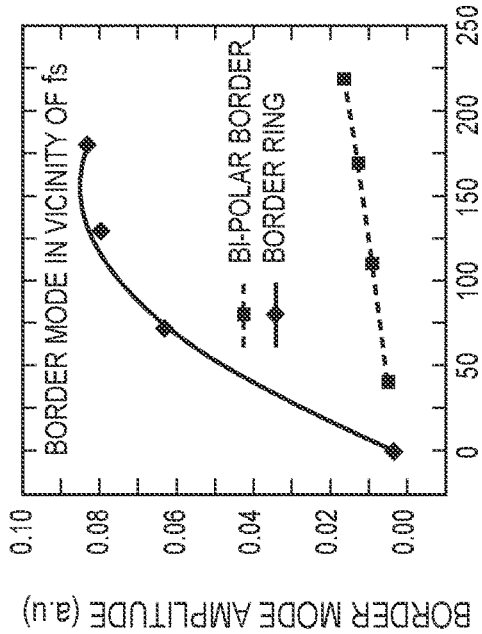

FIG. 9A plots quality factor versus frequency shift with mass loading for BAW resonators with a border ring and with a bi-polar border portion, according to one embodiment.

Figure 9B:
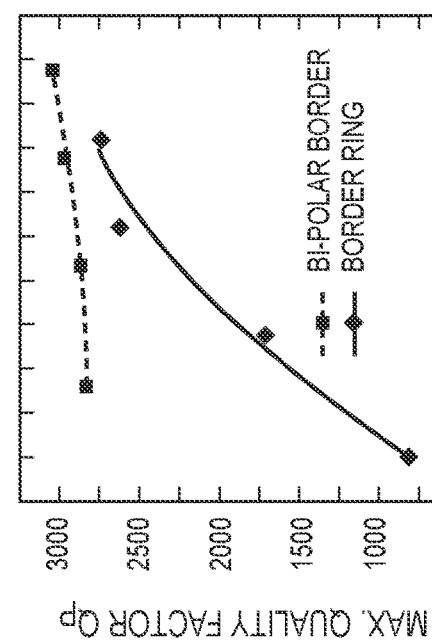

FIG. 9B plots border mode amplitude versus frequency shift with mass loading for BAW resonators with a border ring and with a bi-polar border portion, according to one embodiment.

Figure 9C:
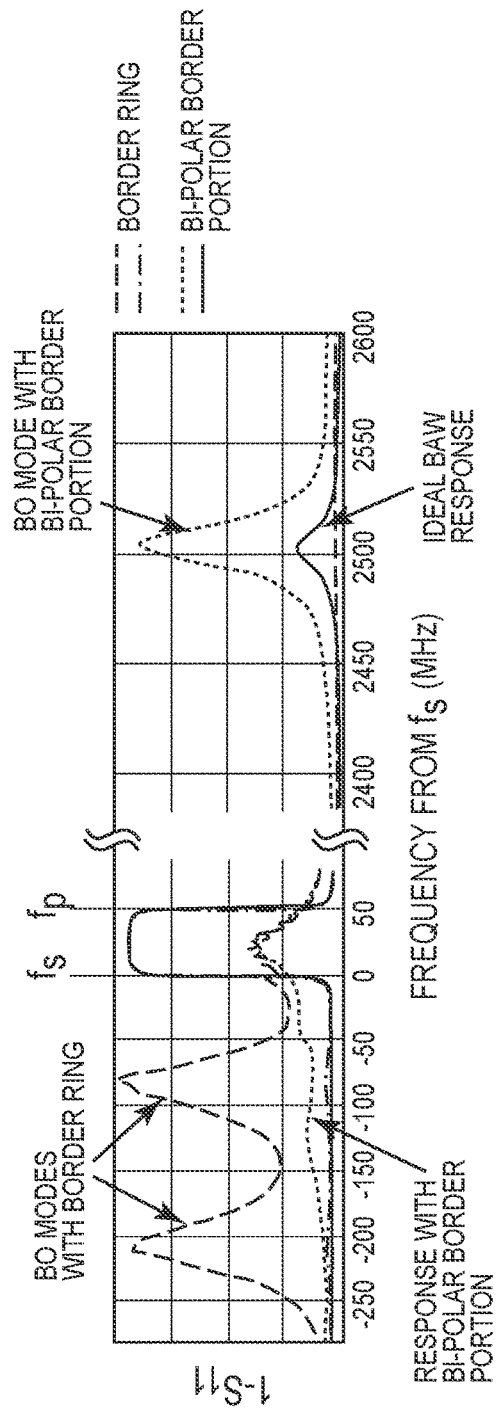

FIG. 9C illustrates border mode content for BAW resonators equipped with a border ring and a bi-polar border portion, according to one embodiment.

Figures 10A, 10B, 10C:
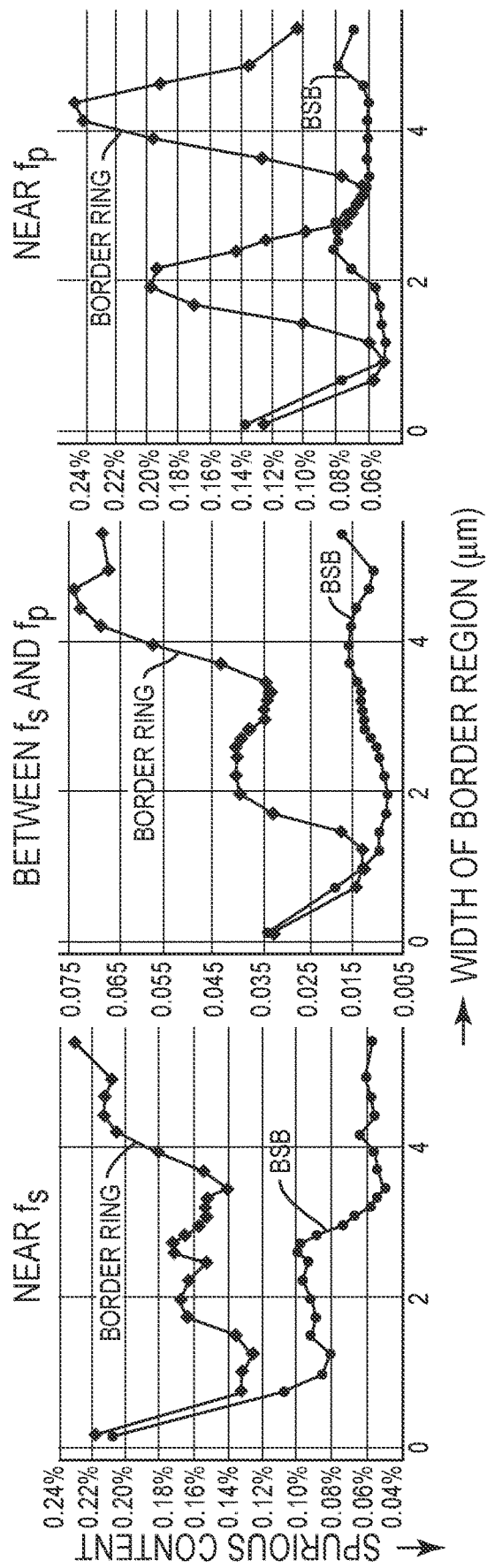

FIGS. 10A, 10B, and 10C illustrate lateral (spurious) mode suppression near the series resonance frequency ($f_s$), between the series resonance frequency ($f_s$) and the parallel resonance frequency ($f_p$), and near the parallel resonance frequency ($f_p$), according to one embodiment.

Figure 11:
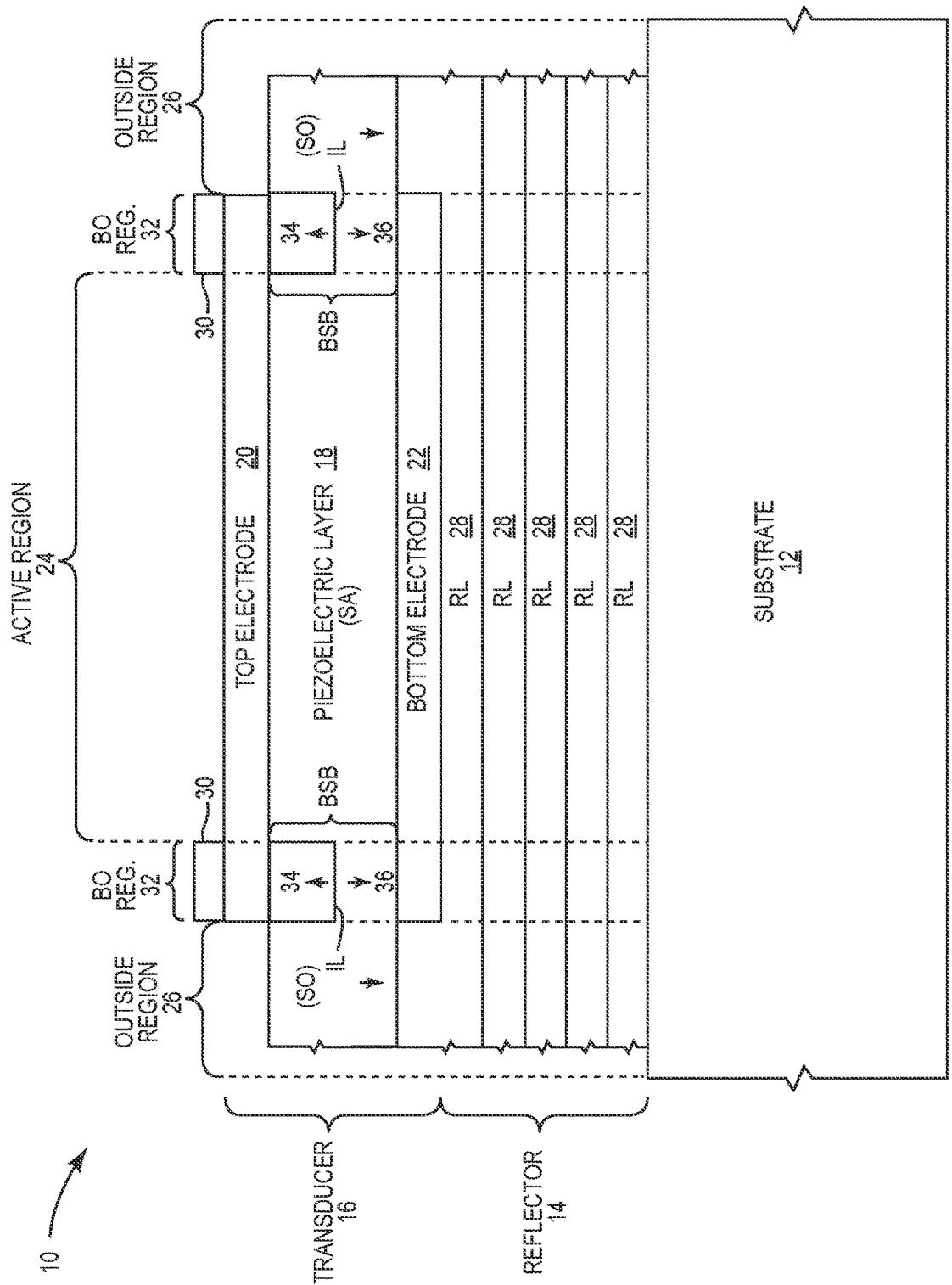

FIG. 11 illustrates a piezoelectric device that provides a border ring and a bi-polar portion in the border region of the piezoelectric layer, according to a second embodiment of the disclosure.

Figure 12:
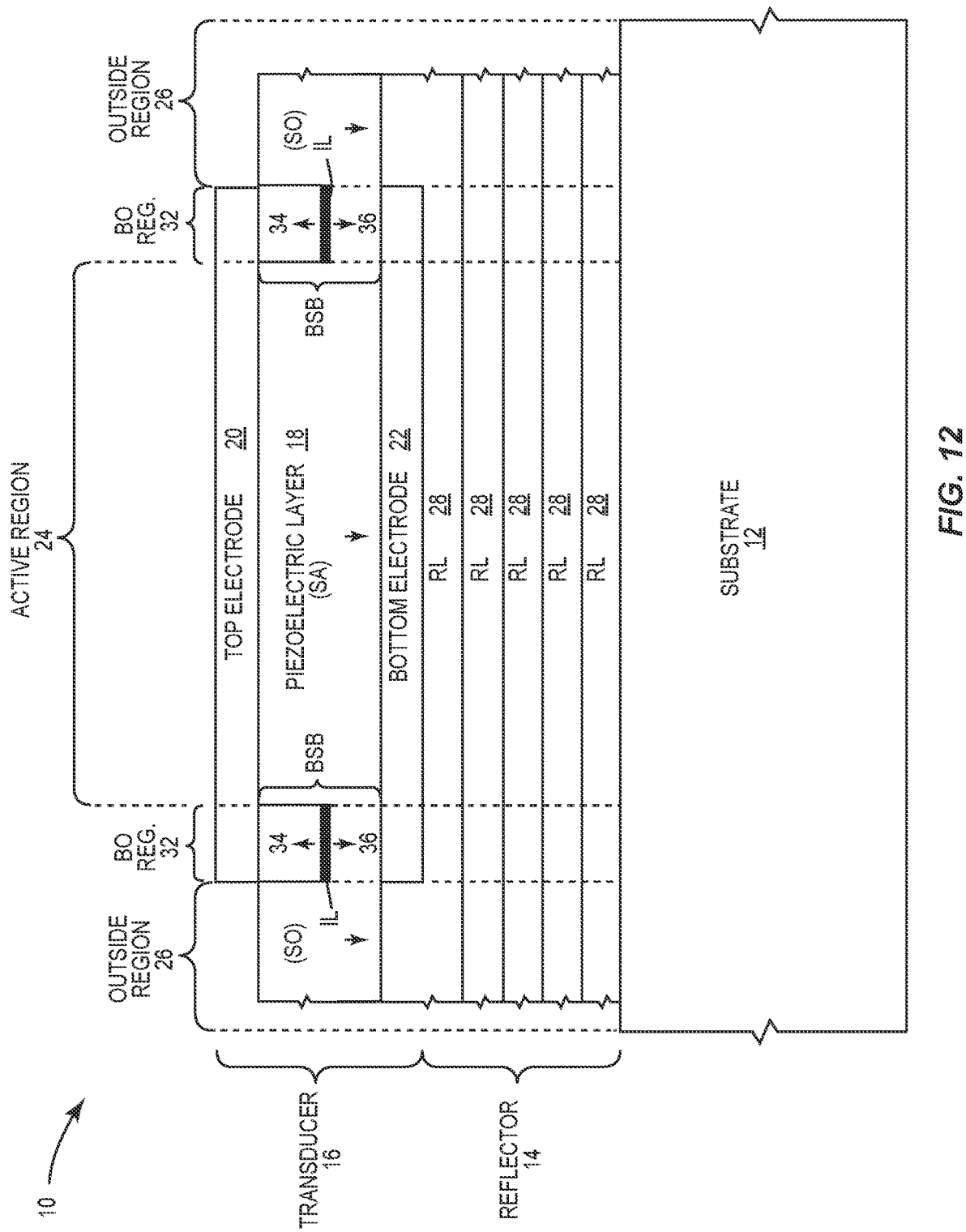

FIG. 12 illustrates a piezoelectric device that provides a bi-polar portion in the border region of the piezoelectric layer, according to a third embodiment of the disclosure.

Figure 13:
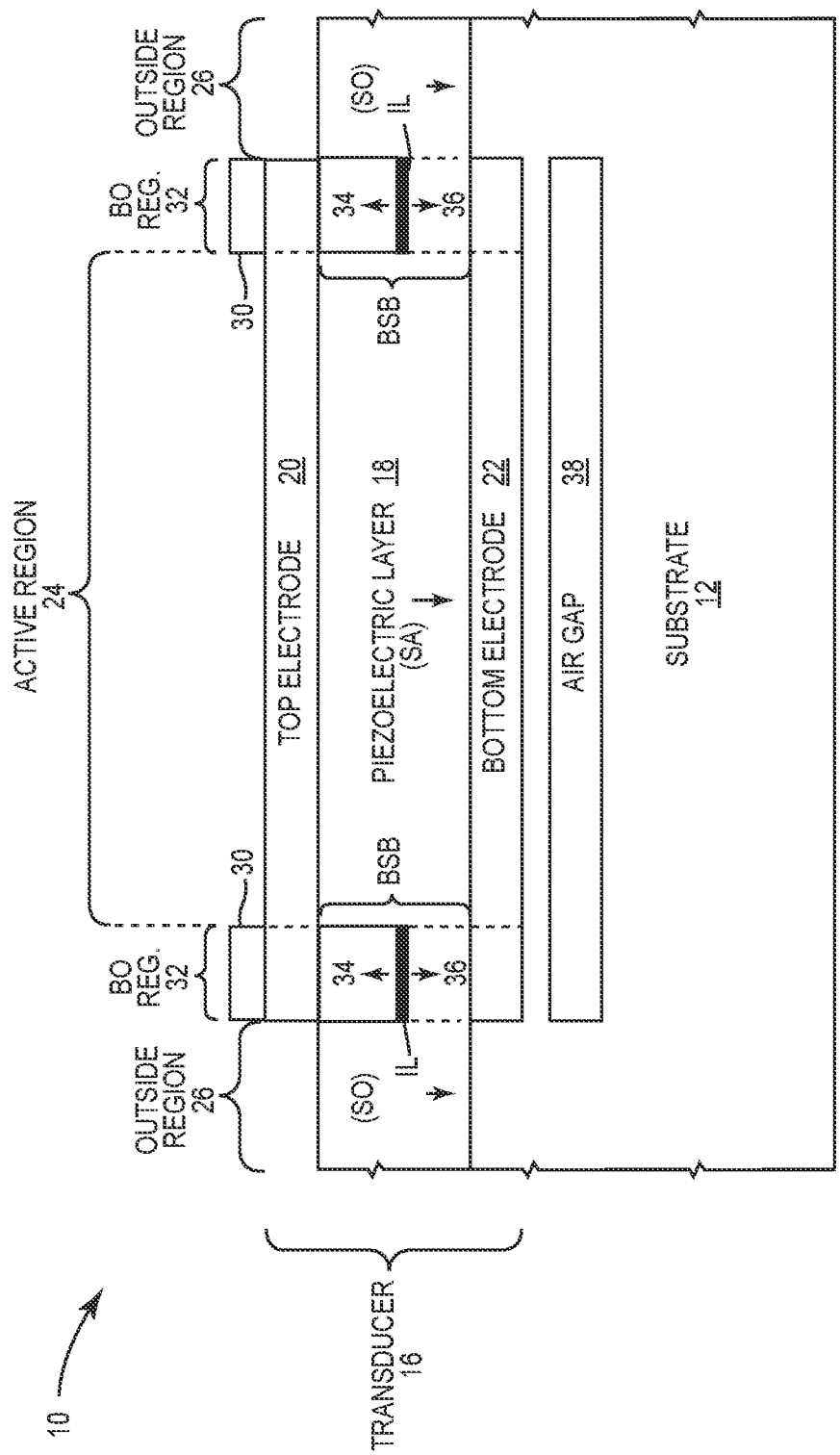

FIG. 13 illustrates a piezoelectric device that provides a bi-polar portion in the border region of the piezoelectric layer, according to a fourth embodiment of the disclosure.

Figure 14:
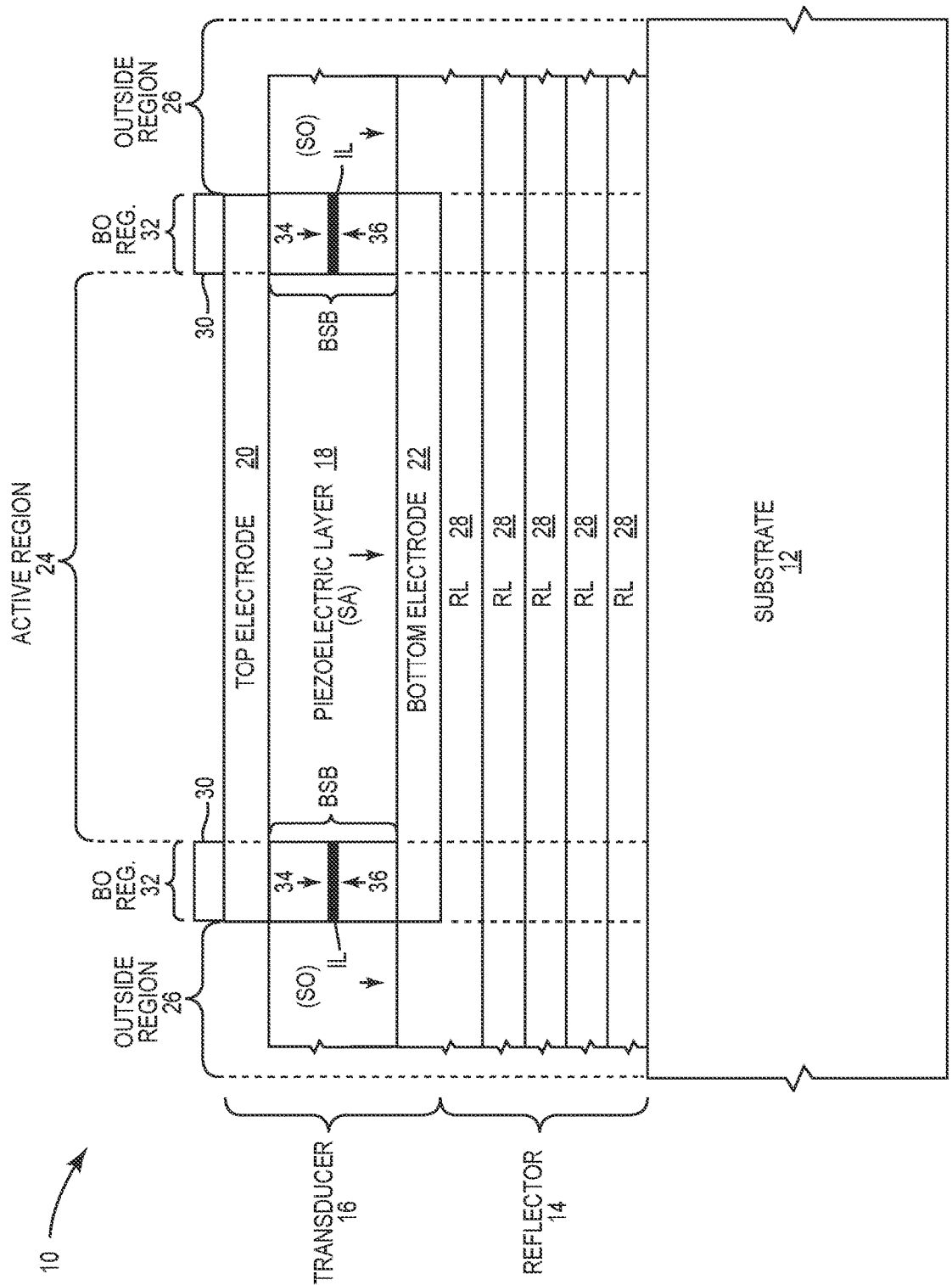

FIG. 14 illustrates a piezoelectric device that provides a bi-polar portion in the border region of the piezoelectric layer, according to a fifth embodiment of the disclosure.

Figure 15:
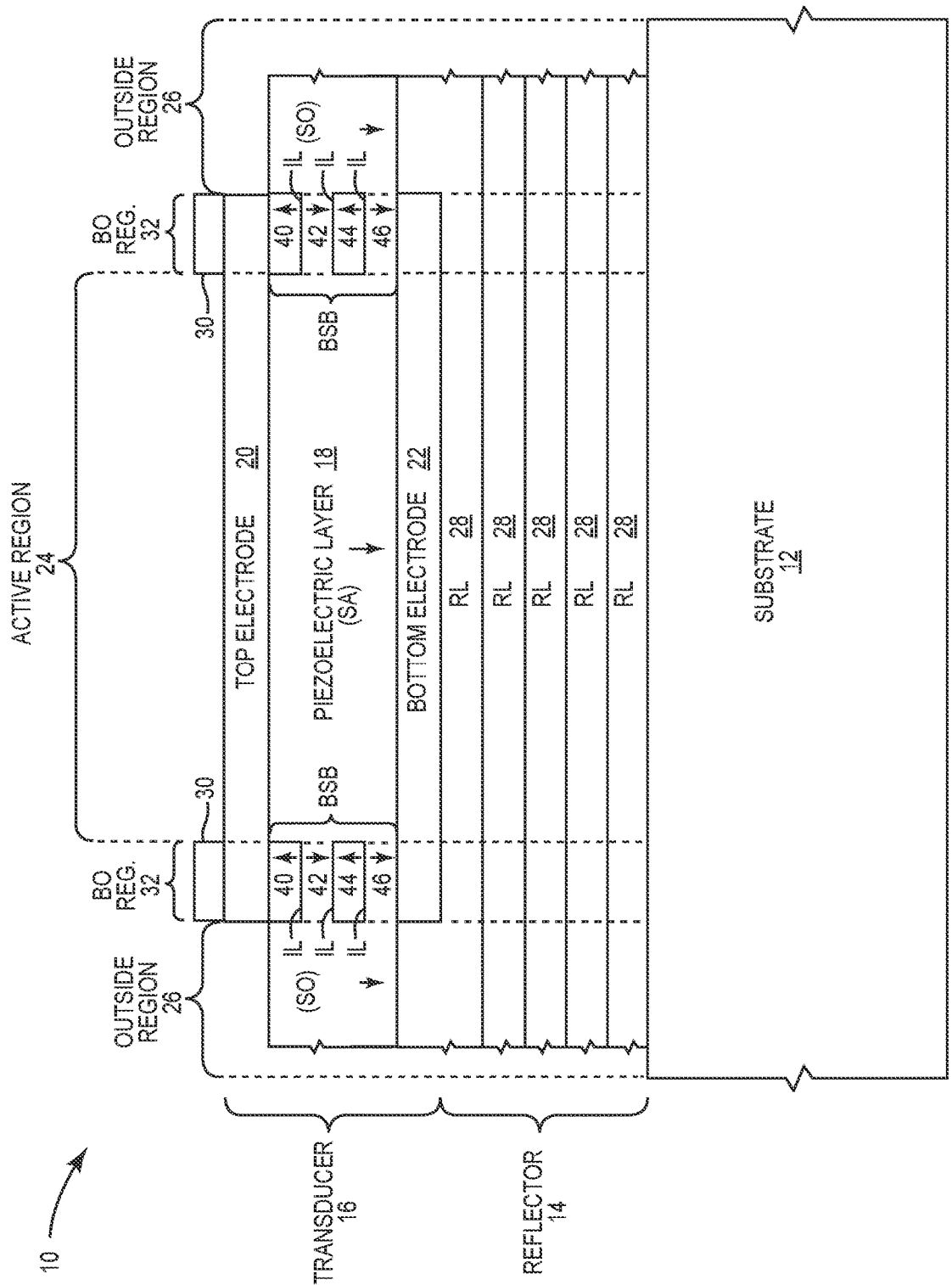

FIG. 15 illustrates a piezoelectric device that provides a bi-polar portion in the border region of the piezoelectric layer, according to a sixth embodiment of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a piezoelectric device with a unique piezoelectric layer and a method for fabricating the same. The piezoelectric device includes a foundation structure and a transducer provided over the foundation structure. The foundation structure includes a piezoelectric layer between a top electrode and a bottom electrode. The piezoelectric layer has an active portion within an active region of the transducer, and a bi-polar border portion within a border region of the transducer. The piezoelectric material in the active portion has a first polarization. The bi-polar border portion has a first sub-portion and a second sub-portion, which resides either above or below the first sub-portion. The piezoelectric material in the first sub-portion has the first polarization, and the piezoelectric material in the second sub-portion has a second polarization, which is opposite the first polarization.

Figure 1:
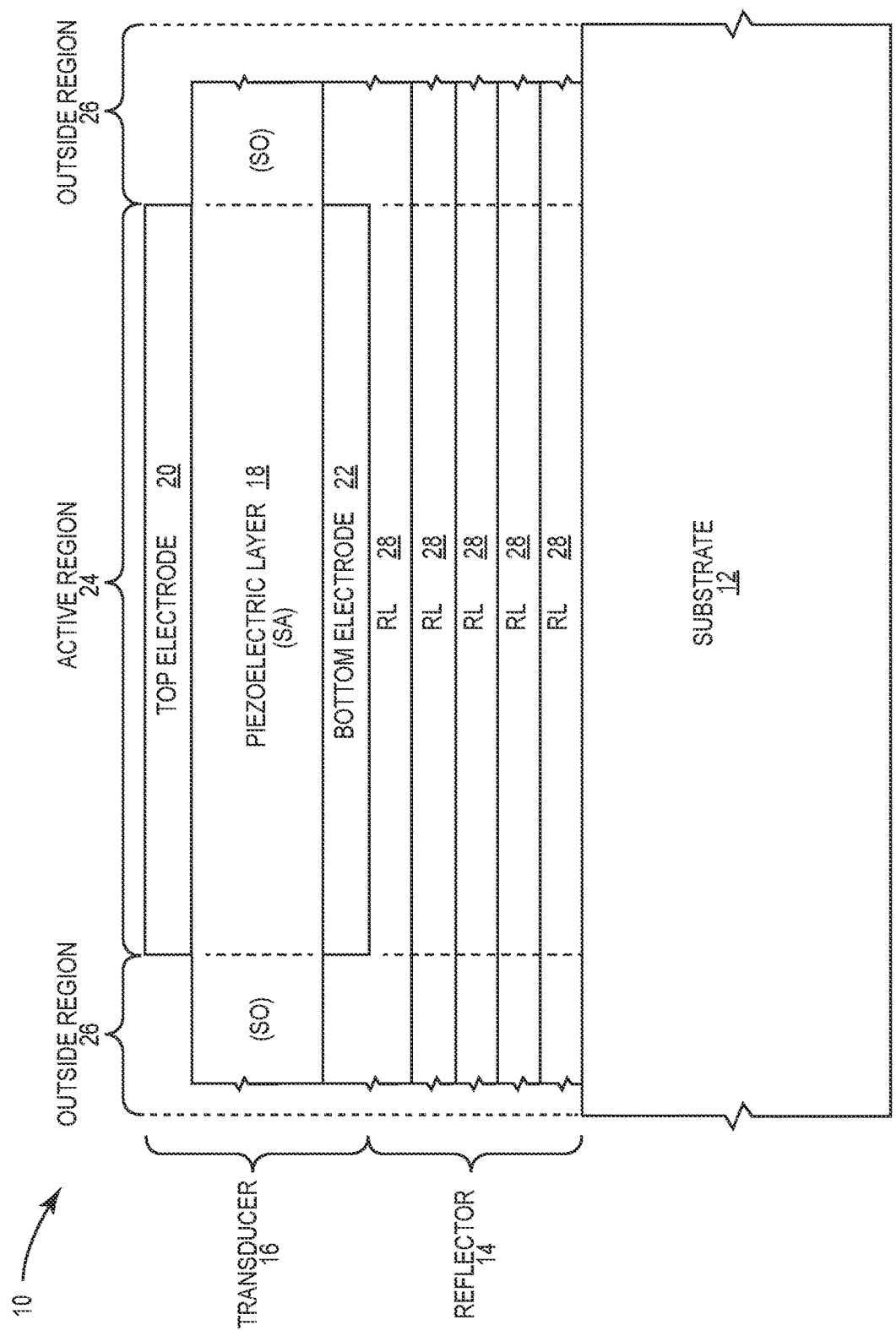
FIG. 1 illustrates a conventional bulk acoustic wave (BAW) resonator.

The piezoelectric device may be implemented in a variety of devices, such as a bulk acoustic wave (BAW) resonator. Prior to delving into the details of the unique piezoelectric film, an overview of a BAW resonator and its operation is described. BAW resonators are used in many high-frequency filter applications. An exemplary BAW resonator 10 is illustrated in FIG. 1. The BAW resonator 10 is a solidly mounted resonator—type BAW resonator 10 and generally includes a substrate 12, a reflector 14 mounted over the substrate 12, and a transducer 16 mounted over the reflector 14. The transducer 16 rests on the reflector 14 and includes a piezoelectric layer 18, which is sandwiched between a top electrode 20 and a bottom electrode 22. The top and bottom electrodes 20 and 22 may be formed of tungsten (W), molybdenum (Mo), platinum (Pt), or like material, and the piezoelectric layer 18 may be formed of aluminum nitride (AlN), zinc oxide (ZnO), or other appropriate piezoelectric material. Although shown in FIG. 1 as including a single layer, the piezoelectric layer 18, the top electrode 20, and/or the bottom electrode 22 may include multiple layers of the same material, multiple layers in which at least two layers are different materials, or multiple layers in which each layer is a different material. The combination of the substrate 12 and the reflector 14 is generally referred to as a foundation structure for the BAW resonator 10, and as such the transducer 16 resides on or over the foundation structure.

Continuing with FIG. 1, the BAW resonator 10 is divided into an active region 24 and an outside region 26. The active region 24 generally corresponds to the section of the BAW resonator 10 where the top and bottom electrodes 20 and 22 overlap and also includes the layers below the overlapping top and bottom electrodes 20 and 22. The outside region 26 corresponds to the section of the BAW resonator 10 that surrounds the active region 24. The portion of the piezoelectric layer 18 that resides in the active region 24 is referred to as an active portion SA, and the portion of the piezoelectric layer 18 that resides in the outside region 26 is referred to as an outer portion SO.

For the BAW resonator 10, applying electrical signals across the top electrode 20 and the bottom electrode 22 excites acoustic waves in the piezoelectric layer 18. These acoustic waves primarily propagate vertically. A primary goal in BAW resonator design is to confine these vertically propagating acoustic waves within the transducer 16. Acoustic waves traveling upwardly are reflected back into the transducer 16 by the air-metal boundary at a top surface of the top electrode 20. Acoustic waves traveling downwardly are reflected back into the transducer 16 by the reflector 14 or by an air cavity (not shown), which is provided just below the transducer in a film BAW resonator (FBAR).

The reflector 14 is typically formed by a stack of reflector layers (RL) 28, which alternate in material composition to produce a significant reflection coefficient at the junction of adjacent reflector layers 28. Typically, the reflector layers 28 alternate between materials having high and low acoustic impedances, such as tungsten (W) and silicon dioxide ($SiO_2$). While only five reflector layers 28 are illustrated in FIG. 1, the number of reflector layers 28 and the structure of the reflector 14 vary from one design to another.

Figure 2:
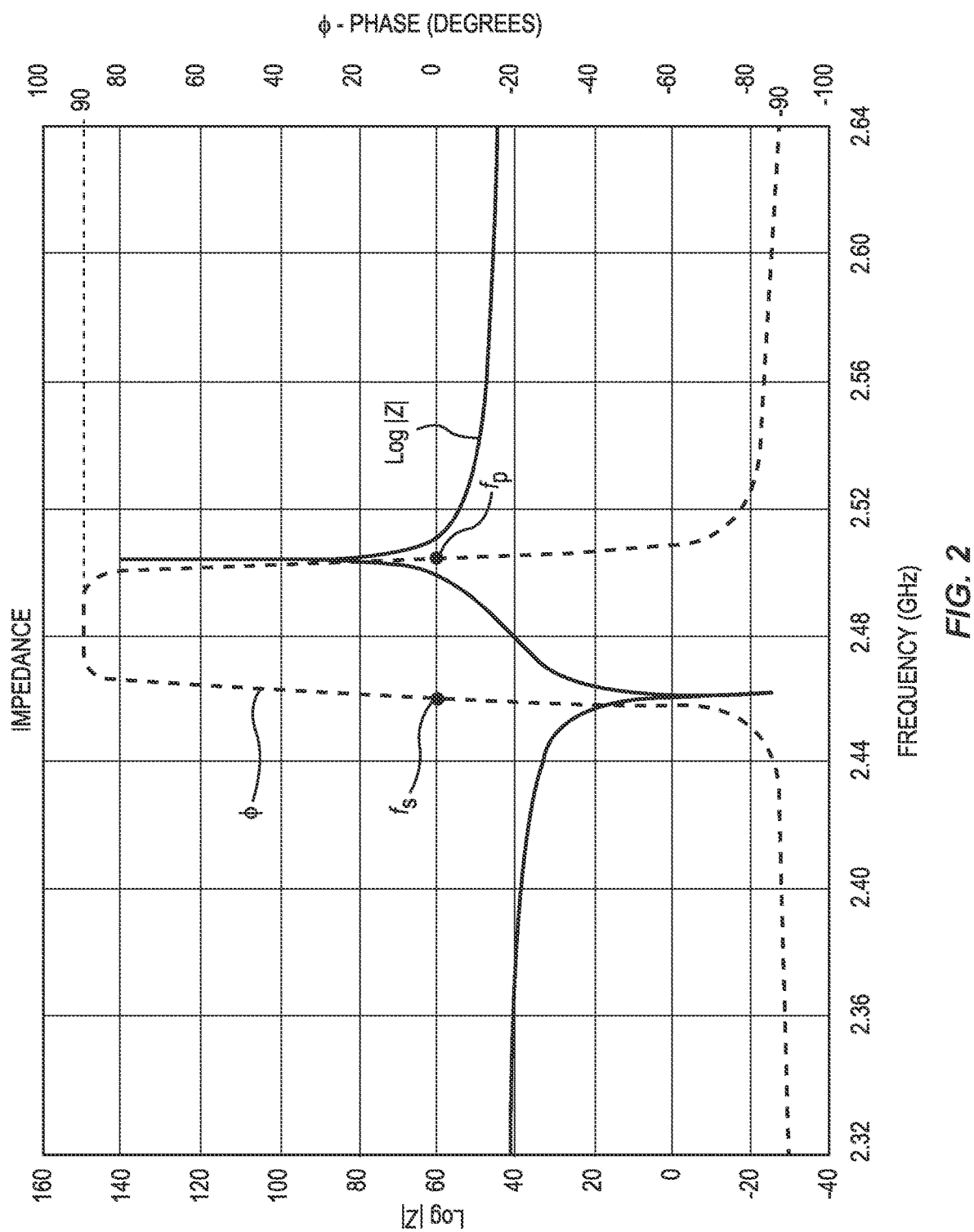
FIG. 2 is a graph of the magnitude and phase of impedance over frequency responses as a function of frequency for an ideal BAW resonator.

The magnitude (Z) and phase (φ) of the electrical impedance as a function of the frequency for a relatively ideal BAW resonator 10 is provided in FIG. 2. The magnitude (Z) of the electrical impedance is illustrated by the solid line, while the phase (φ) of the electrical impedance is illustrated by the dashed line. A unique feature of the BAW resonator 10 is that it has both a resonance frequency and an anti-resonance frequency. The resonance frequency is typically referred to as the series resonance frequency ($f_s$), and the anti-resonance frequency is typically referred to as the parallel resonance frequency ($f_p$). The series resonance frequency ($f_s$) occurs when the magnitude of the impedance, or reactance, of the BAW resonator 10 approaches zero. The parallel resonance frequency ($f_p$) occurs when the magnitude of the impedance, or reactance, of the BAW resonator 10 peaks at a significantly high level. In general, the series resonance frequency ($f_s$) is a function of the thickness of the piezoelectric layer 18 and the mass of the bottom and top electrodes 20 and 22.

For the phase, the BAW resonator 10 acts like an inductance that provides a 90° phase shift between the series resonance frequency ($f_s$) and the parallel resonance frequency ($f_p$). In contrast, the BAW resonator 10 acts like a capacitance that provides a −90° phase shift below the series resonance frequency ($f_s$) and above the parallel resonance frequency ($f_p$). The BAW resonator 10 presents a very low, near zero, resistance at the series resonance frequency ($f_s$) and a very high resistance at the parallel resonance frequency ($f_p$). The electrical nature of the BAW resonator 10 lends itself to the realization of a very high Q (quality factor) inductance over a relatively short range of frequencies, which has proved to be very beneficial in high frequency filter networks, especially those operating at frequencies around 1.8 GHz and above.

Figures 3A, 3B, 3C:
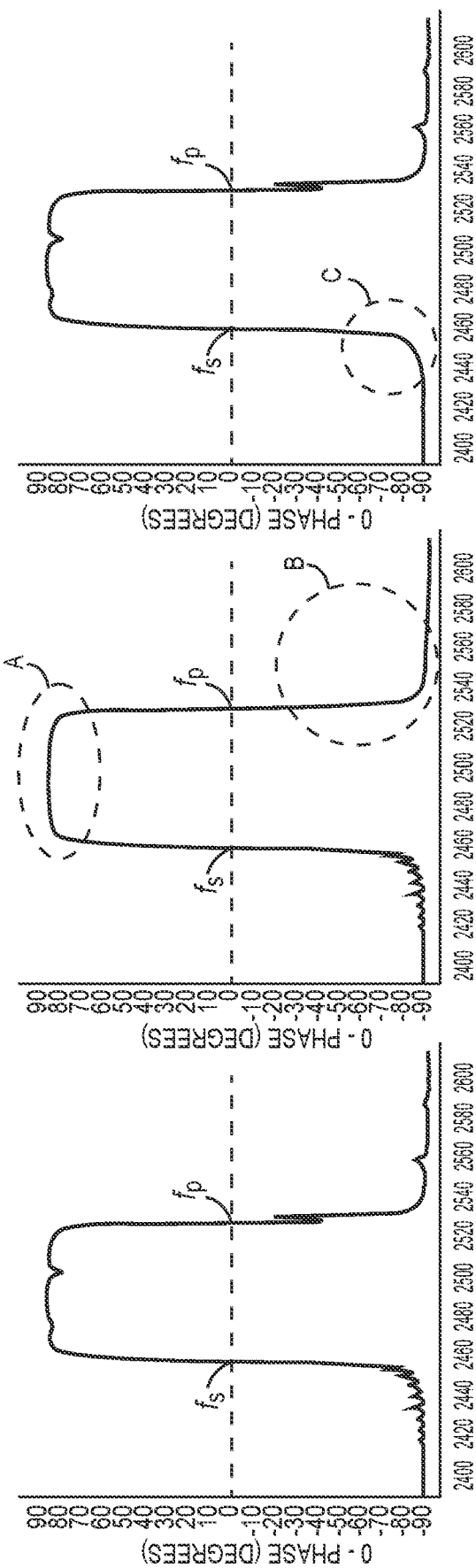
FIGS. 3A-3C are graphs of phase responses for various BAW resonator configurations.

Unfortunately, the phase (φ) curve of FIG. 2 is representative of an ideal phase curve. In reality, approaching this ideal is challenging. A typical phase curve for the BAW resonator 10 of FIG. 1 is illustrated in FIG. 3A. Instead of being a smooth curve, the phase curve of FIG. 3A includes ripple below the series resonance frequency ($f_s$), between the series resonance frequency ($f_s$) and the parallel resonance frequency ($f_p$), and above the parallel resonance frequency ($f_p$). The ripple is the result of spurious modes, which are caused by spurious resonances that occur in corresponding frequencies. While the vast majority of the acoustic waves in the BAW resonator 10 propagate vertically, various boundary conditions about the transducer 16 result in the propagation of lateral (horizontal) acoustic waves, which are referred to as lateral standing waves. The presence of these lateral standing waves reduces the potential Q associated with the BAW resonator 10.

Figure 4:
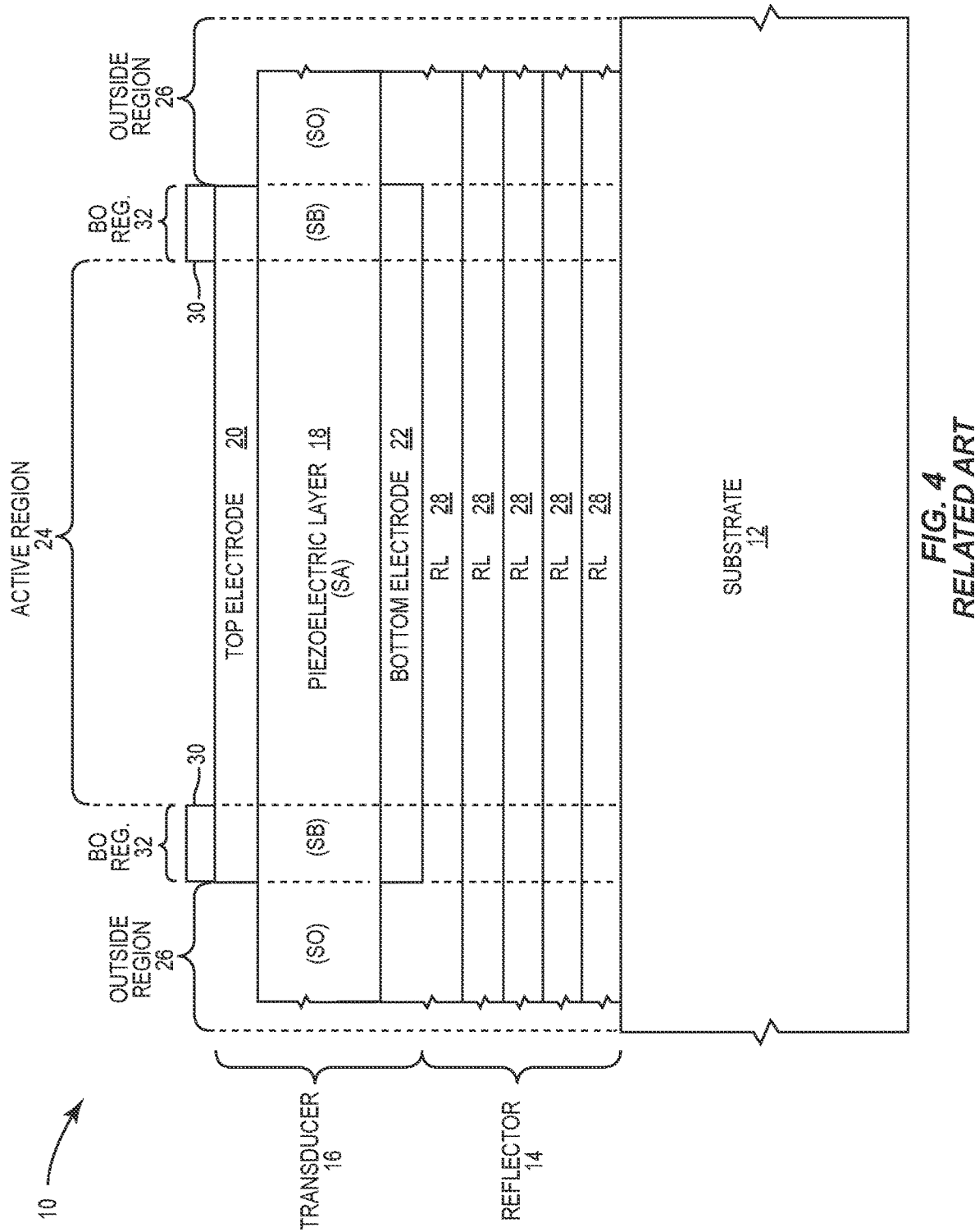
FIG. 4 illustrates a conventional BAW resonator with a border ring.

As illustrated in FIG. 4, a border (BO) ring 30 is formed on or within the top electrode 20 to suppress certain of the spurious modes. The spurious modes that are suppressed by the BO ring 30 are those above the series resonance frequency ($f_s$), as highlighted by circles A and B in the phase curve of FIG. 3B. Circle A shows a suppression of the ripple, and thus the spurious mode, in the passband of the phase curve, which resides between the series resonance frequency ($f_s$) and the parallel resonance frequency ($f_p$). Circle B shows suppression of the ripple, and thus the spurious modes, above the parallel resonance frequency ($f_p$). Notably, the spurious mode in the upper shoulder of the passband, which is just below the parallel resonance frequency ($f_p$), and the spurious modes above the passband are suppressed, as evidenced by the smooth or substantially ripple-free phase curve between the series resonance frequency ($f_s$) and the parallel resonance frequency ($f_p$) and above the parallel resonance frequency ($f_p$).

The BO ring 30 corresponds to a mass loading of the portion of the top electrode 20 that extends about the periphery of the active region 24. The BO ring 30 may correspond to a thickened portion of the top electrode 20 or the application of additional layers of an appropriate material over the top electrode 20. The portion of the BAW resonator 10 that includes and resides below the BO ring 30 is referred to as a border (BO) region 32. The portion of the piezoelectric layer 18 within the BO region 32 is referred to as a border portion SB. Accordingly, the BO region 32 generally resides between the active region 24 and the outside region 26, and the border portion SB resides between the active portion SA and the outer portion SO.

While the BO ring 30 is effective at suppressing spurious modes above the series resonance frequency ($f_s$), the BO ring 30 generally has much less impact on those spurious modes below the series resonance frequency ($f_s$), as shown in FIG. 3B. A technique referred to as apodization is often used to suppress the spurious modes that fall below the series resonance frequency ($f_s$).

Apodization works to reduce any lateral symmetry in the BAW resonator 10, or at least in the transducer 16 thereof. The lateral symmetry corresponds to the footprint of the transducer 16, and avoiding the lateral symmetry corresponds to avoiding symmetry associated with the sides of the footprint. For example, one may choose a footprint that corresponds to a pentagon instead of a square or rectangle. Avoiding symmetry helps reduce the presence of lateral standing waves in the transducer 16. Circle C of FIG. 3C illustrates the effect of apodization in which the spurious modes below the series resonance frequency ($f_s$) are suppressed. Assuming no BO ring 30 is provided, one can readily see in FIG. 3C that apodization fails to suppress those spurious modes above the series resonance frequency ($f_s$). As such, the typical BAW resonator 10 employs both apodization and the BO ring 30.

Figure 5A:
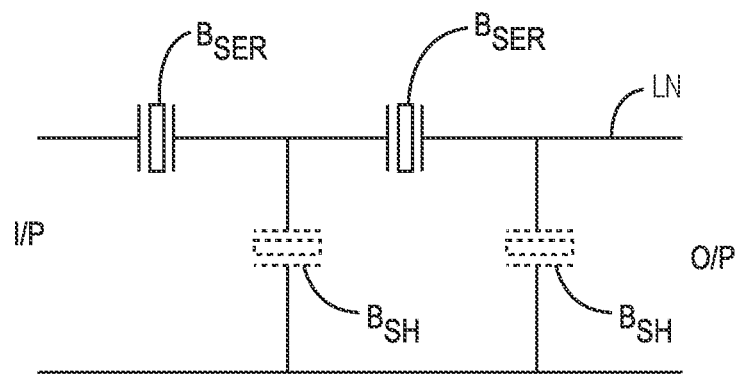
FIG. 5A is a schematic of a conventional ladder network.
Figure 5B:
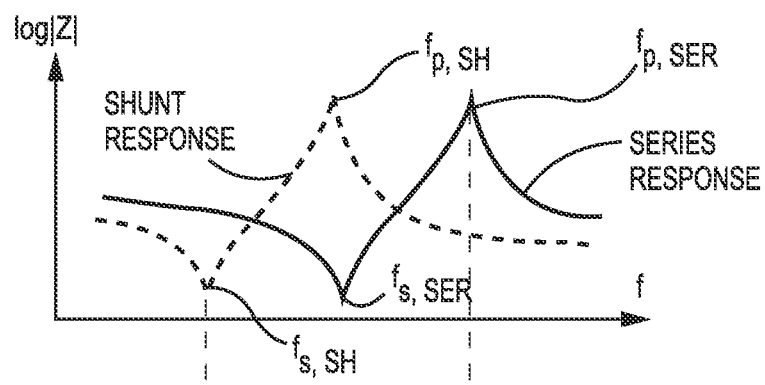
FIGS. 5B and 5C are graphs of a frequency response for BAW resonators in the conventional ladder network of FIG. 5A and a frequency response for the conventional ladder network of FIG. 5A.

As noted previously, BAW resonators 10 are often used in filter networks that operate at high frequencies and require high Q values. A basic ladder network LN is illustrated in FIG. 5A. The ladder network LN includes two series resonators $B_{SER}$ and two shunt resonators $B_{SH}$, which are arranged in a traditional ladder configuration. Typically, the series resonators $B_{SER}$ have the same or similar first frequency response, and the shunt resonators $B_{SH}$ have the same or similar second frequency response, which is different from the first frequency response, as shown in FIG. 5B. In many applications, the shunt resonators $B_{SH}$ are a detuned version of the series resonators $B_{SER}$. As a result, the frequency responses for the series resonators $B_{SER}$ and the shunt resonators $B_{SH}$ are generally very similar, yet shifted relative to one another such that the parallel resonance frequency ($f_{p,SH}$) of the shunt resonators approximates the series resonance frequency ($f_{s,SER}$) of the series resonators $B_{SER}$. Note that the series resonance frequency ($f_{s,SH}$) of the shunt resonators $B_{SH}$ is less than the series resonance frequency ($f_{s,SER}$) of the series resonators $B_{SER}$. The parallel resonance frequency ($f_{p,SH}$) of the shunt resonators $B_{SH}$ is less than the parallel resonance frequency ($f_{p,SER}$) of the series resonators $B_{SER}$.

Figure 5C:
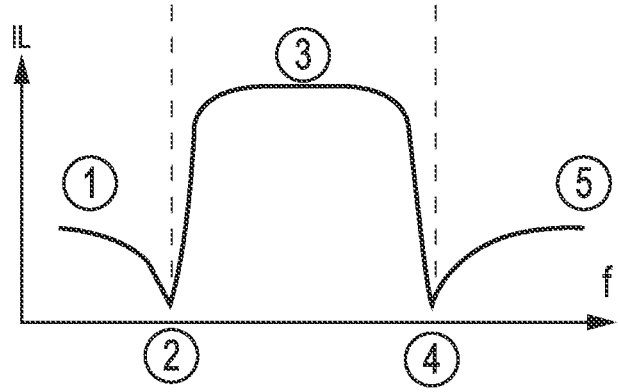

FIG. 5C is associated with FIG. 5B and illustrates the response of the ladder network LN. The series resonance frequency ($f_{s,SH}$) of the shunt resonators $B_{SH}$ corresponds to the low side of the passband's skirt (phase 2), and the parallel resonance frequency ($f_{p,SER}$) of the series resonators $B_{SER}$ corresponds to the high side of the passband's skirt (phase 4). The substantially aligned series resonance frequency ($f_{s,SER}$) of the series resonators $B_{SER}$ and the parallel resonance frequency ($f_{p,SH}$) of the shunt resonators $B_{SH}$ fall within the passband. FIGS. 6A through 6E provide circuit equivalents for the five phases of the response of the ladder network LN. During the first phase (phase 1, FIGS. 5C, 6A), the ladder network LN functions to attenuate the input signal. As the series resonance frequency ($f_{s,SH}$) of the shunt resonators $B_{SH}$ is approached, the impedance of the shunt resonators $B_{SH}$ drops precipitously, such that the shunt resonators $B_{SH}$ essentially provide a short to ground at the series resonance frequency ($f_{s,SH}$) of the shunt resonators (phase 2, FIGS. 5C, 6B). At the series resonance frequency ($f_{s,SH}$) of the shunt resonators $B_{SH}$ (phase 2), the input signal is essentially blocked from the output of the ladder network LN.

Figure 6A:
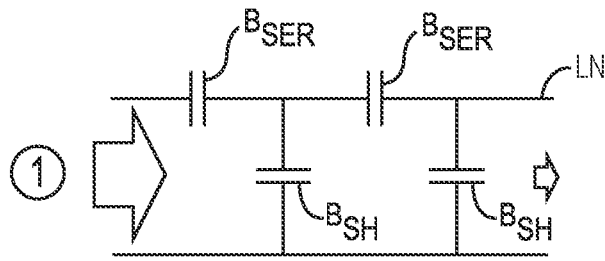
FIGS. 6A-6E are circuit equivalents for the ladder network of FIG. 5A at the frequency points 1, 2, 3, 4, and 5, which are identified in FIG. 5C.
Figure 6B:
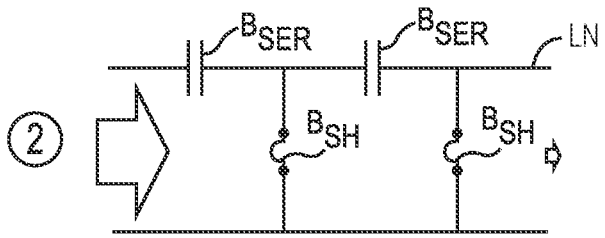
Figure 6C:
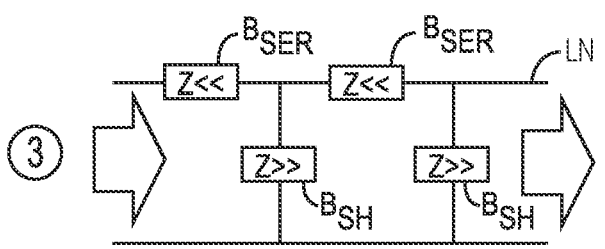
Figure 6D:
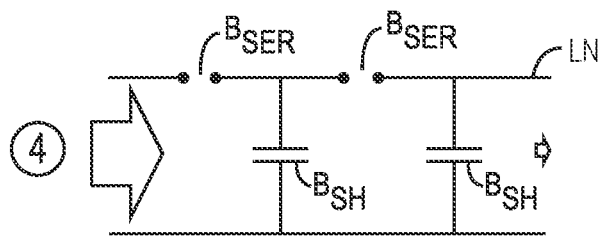
Figure 6E:
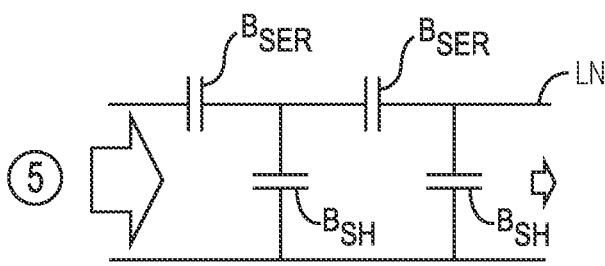

Between the series resonance frequency ($f_{s,SH}$) of the shunt resonators $B_{SH}$ and the parallel resonance frequency ($f_{p,SER}$) of the series resonators $B_{SER}$, which corresponds to the passband, the input signal is passed to the output with relatively little or no attenuation (phase 3, FIGS. 5C, 6C). Within the passband, the series resonators $B_{SER}$ present relatively low impedance, while the shunt resonators $B_{SH}$ present a relatively high impedance, wherein the combination of the two leads to a flat passband with steep low-side and high-side skirts. As the parallel resonance frequency ($f_{p,SER}$) of the series resonators $B_{SER}$ is approached, the impedance of the series resonators $B_{SER}$ becomes very high, such that the series resonators $B_{SER}$ essentially present themselves as an open at the parallel resonance frequency ($f_{p,SER}$) of the series resonators (phase 4, FIGS. 5C, 6D). At the parallel resonance frequency ($f_{p,SER}$) of the series resonators $B_{SER}$ (phase 4), the input signal is again essentially blocked from the output of the ladder network LN. During the final phase (phase 5, FIGS. 5C, 6E), the ladder network LN functions to attenuate the input signal in a similar fashion to that provided in phase 1. As the parallel resonance frequency ($f_{p,SER}$) of the series resonators $B_{SER}$ is passed, the impedance of the series resonators $B_{SER}$ decreases, and the impedance of the shunt resonators $B_{SH}$ normalizes. Thus, the ladder network LN functions to provide a high Q passband between the series resonance frequency ($f_{s,SH}$) of the shunt resonators $B_{SH}$ and the parallel resonance frequency ($f_{p,SER}$) of the series resonators $B_{SER}$. The ladder network LN provides extremely high attenuation at both the series resonance frequency ($f_{s,SH}$) of the shunt resonators $B_{SH}$ and the parallel resonance frequency ($f_{p,SER}$) of the series resonators. The ladder network LN provides good attenuation below the series resonance frequency ($f_{s,SH}$) of the shunt resonators $B_{SH}$ and above the parallel resonance frequency ($f_{p,SER}$) of the series resonators $B_{SER}$.

In a single modern communication system, such as a mobile telephone, numerous filters require passbands of different bandwidths and centered at different frequencies. The center frequencies of filters that employ BAW resonators 10 are primarily governed by the thicknesses of the various layers of the transducer 16 and, in particular, the thickness of the piezoelectric layer 18. The passband bandwidths and shapes of the band edges of the filters are primarily governed by the electromechanical coupling coefficient k of the piezoelectric layer 18. An electromechanical coupling coefficient k is the measure of the effectiveness of the piezoelectric layer in converting electrical energy to mechanical energy, and vice versa. Different piezoelectric materials or material compositions generally have different electromechanical coupling coefficients k.

For passbands having bandwidths less than 100 MHz, aluminum nitride (AlN) is a common choice for the piezoelectric layer 18. For passband having bandwidth greater than 100 MHz, newer piezoelectric materials that provide an increased electromechanical coupling coefficient k are being employed. These newer piezoelectric materials include, but are not limited to, aluminum nitride that has been doped with one or more transition metals, such as scandium (Sc), yttrium (Y), magnesium (Mg), zirconium (Zr), and the like, alone or in combination with other materials such as erbium (Er), magnesium (Mg), and the like. Exemplary piezoelectric materials include, but are not limited to ScAlN, YAlN, [Mg][Zr]AlN, [Sc][Er]AlN, and the like.

Unfortunately, each of these piezoelectric materials has a fairly specific electromechanical coupling factor k. As a result, designers currently have to pick a particular piezoelectric material and then design the rest of the BAW resonator 10 and the filters that employ the BAW resonator 10 around the electromechanical coupling factor k of the chosen piezoelectric material. In other words, the choice of the piezoelectric material for the piezoelectric layer 18 restricts the electromechanical coupling factor k and, as such, ultimately limits the ability of the designer to optimize the performance of the overall filter design.

Further, designers would benefit from a technique for providing electromechanical coupling in certain areas of the piezoelectric layer 18 and providing essentially zero electromechanical coupling in other areas of the piezoelectric layer 18. For example, one would like to provide electromechanical coupling at a desired level in the active regions 24 of the BAW resonators 10 and little or no electromechanical coupling in the outside regions 26 and/or BO regions 32.

The electromechanical coupling factor of a material is a function of the piezoelectric properties of the material. As such, non-piezoelectric materials exhibit little or no electromechanical coupling and thus have an electromechanical coupling factor k of zero or approaching zero. The piezoelectric materials exhibit an electromechanical coupling factor k based at least in part on the piezoelectric properties of the material.

The following describes a technique for providing both piezoelectric and non-piezoelectric portion, or regions, in the piezoelectric layer 18. As described above, multiple BAW resonators 10 are often used in conjunction to form ladder networks LN and the like. In many instances, the multiple BAW resonators 10 that are used to form the ladder networks LN are integrated on a single die, wherein the transducers 16 of the different BAW resonators 10 share a common substrate 12, reflector 14, and the like. Further, the piezoelectric layers 18, top electrodes 20, and bottom electrodes 22 are individually formed from common material layers through appropriate deposition and etching processes.

Figure 7:
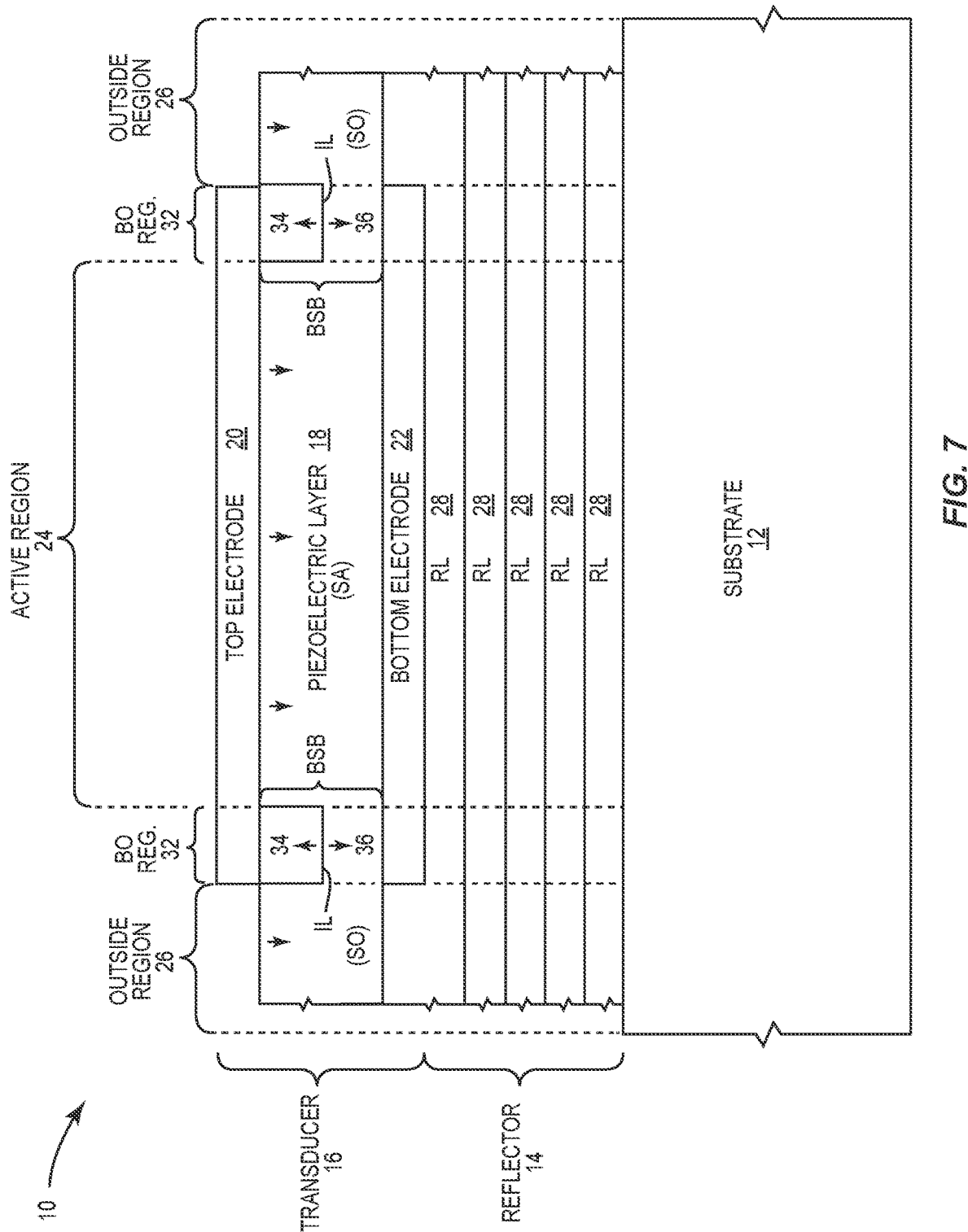
FIG. 7 illustrates a piezoelectric device that provides a bi-polar portion in the border region of the piezoelectric layer, according to a first embodiment of the disclosure.

With reference to FIG. 7, the present disclosure relates to a piezoelectric layer 18 in which the portion of the piezoelectric layer 18 that resides in the BO region 32 is bi-polar. This bi-polar portion is referred to as a bi-polar border portion BSB. In most embodiments, the active portion SA in the active region 24 remains unipolar. The outer portion SO in the outside region 26 may be unipolar or bi-polar in different embodiments. A piezoelectric material has intrinsic polar orientation, and the direction of polar orientation for one embodiment is shown by arrows in FIG. 7. For BAW resonators, the vertical polarizations ('up' or 'down') are significant for electromechanical conversion. Within the active portion SA and the outer portion SO of the piezoelectric layer 18, the polar orientation is constant throughout the respective portions and as such is unipolar.

In contrast, the bi-polar border portion BSB of the piezoelectric layer 18 is formed to have sub-portions 34, 36, which have opposing polarizations, as indicated by the opposing arrows within those portions. The sub-portions 34, 36 of the bi-polar border portion BSB may be formed from the same material as the rest of the piezoelectric layer 18 but are formed to have opposing polarizations. An inversion layer IL represents the border between the sub-portions 34, 36 of the bi-polar border portion BSB. The inversion layer IL may simply represent a polarization transition level or an actual structure of one or more layers that actually triggered the polarization reversal during fabrication, which is described in further detail subsequently.

Since the polarity change does not affect the acoustic properties of the piezoelectric layer, the active portion SA and bi-polar border portion SB are acoustically similar and there is essentially no additional mass loading within bi-polar border portion BSB of the piezoelectric layer 18 caused by making border portion SB bi-polar. As a result, the bi-polar border portion BSB confines the lateral acoustic energy with or without the need for the mass loading, thereby potentially eliminating the need for a BO ring 30, which is not present in the embodiment of FIG. 7. The resulting quality factor Q is better or comparable to values realized by designs that incorporate BO rings 30.

Incorporation of the bi-polar border portion BSB does not generate border (BO) modes in the vicinity of active area series resonance frequency ($f_s$). "Vicinity" is defined as being within 300 MHz of the series resonance frequency ($f_s$). Instead, the BO mode shifts to several thousands of megahertz above the active area series resonance frequency ($f_s$), thereby having virtually no effect on performance of filters that employ these BAW resonators 10. Use of the bi-polar border portion BSB also reduces the spurious lateral modes better or comparable to the conventional designs that incorporate BO rings 30. Further detail on these and other benefits is provided subsequently.

Common piezoelectric materials for the piezoelectric layer 18 include group III-V nitrides, primarily aluminum nitride (AlN) and AlN doped with transition metals such as Sc, Er, Mg, Hf, and the like. If the piezoelectric layer 18 is formed from AlN, the direction of the Al—N bond along the c-axis of the AlN crystalline structure determines the polarization, or polarity direction, of the AlN crystalline structure. The polarization of the material can be inverted by flipping the direction of Al—N bond during growth of the piezoelectric layer 18. Several processing methods exist to achieve polarization inversion of III-V nitrides. For example, AlN grows with N-polarity (N-polar) on and over certain metal surfaces, such as W, Cu, and Mo, while it grows with Al-polarity (Al-polar) on and over surfaces such as Al, Ru, and $RuO_2$. An appropriate inversion layer IL may be deposited and patterned lithographically in the BO region 32 during the growth process for the piezoelectric layer 18 to achieve the bi-polar border portion BSB illustrated in FIG. 7.

For the illustrated embodiment, a solidly mounted resonator or FBAR foundation structure is provided. The bottom electrode 22 is formed over the foundation structure by depositing an appropriate metal layer or the like over the piezoelectric layer foundation structure and then etching the metal layer in a manner leaving the bottom electrode 22. Next, a lower portion of the piezoelectric layer 18 is grown with a first polarization to a first thickness over the bottom electrode 22 and through the outside region 26, the BO region 32, and the active region 24. At this level, an appropriate metal layer or the like is deposited over the piezoelectric layer 18 and then etched in a manner leaving the inversion layer IL. As noted previously, the inversion layer IL resides in the BO region 32.

Next, the growth process for the piezoelectric layer 18 resumes such that an upper portion of the piezoelectric layer 18 is grown over the lower portion of the piezoelectric layer 18 across the outside region 26, BO region 32, and active region 24 until the piezoelectric layer 18 reaches a second thickness. Notably, the polarization of piezoelectric layer 18 that is grown over the inversion layer IL is inverted, and as such, the piezoelectric layer 18 over the inversion layer IL and within the BO region 32 has a second polarization, which is opposite that of the first polarization. The polarization of the piezoelectric layer 18 that is grown in the active portion SA and the outer portion SO is not inverted, and as such, has the first polarization. The top electrode 20 is formed over the piezoelectric layer 18 by depositing an appropriate metal layer or the like over the piezoelectric layer and then etching the metal layer in a manner leaving the top electrode 20.

FIG. 8A illustrates an aluminum polar (Al-polar) orientation wherein the growth direction is along the c-axis of the atomic structure. For an Al-polar atomic structure, the Al—N atomic bond along c-axis is such that Al atom resides below the N atom. The net polarity, $P_{NET}$, is inverted, as represented by the downward arrow. The opposite is true for a nitrogen polar (N-polar) orientation with growth direction is along the c-axis, as illustrated in FIG. 8B. For a N-polar atomic structure, the Al—N atomic bond along c-axis is such that N atom resides below the Al atom. The net polarity, $P_{NET}$, is aligned with the growth direction, as represented by the upward arrow. As such, the polarization of the Al-polar orientation is opposite that of the N-polar orientation. While aluminum nitride is used in this example, other piezoelectric compounds may be used for the piezoelectric material and an appropriate metal, such as the metal of the compound, may be used to form the inversion layer IL.

The ratio of the thicknesses of the sub-portions 34, 36, which have opposite polarization, may be chosen to cancel the fundamental BAW mode in the BO region 32. The thicknesses of the respective layers may be, but need not be, 1:1. The particular ratio may depend on the stack of materials and elements beneath and above the piezoelectric layer 18. Typically, the ratio ranges from 0.7:1 to 1.3:1 for most of the BAW resonators, while other embodiments may require a tighter range of 0.8:1 to 1.2:1, 0.9:1 to 1.1:1, 0.95:1 to 1.05:1, and the like. Other broader or tighter ranges are possible and are considered to be within the scope of this disclosure. While the bi-polar border portion BSB is shown to switch polarization only once, multiple polarity switches (i.e., alternating two or more of each sub-portion 34, 36) throughout the thickness of piezoelectric layer 18 is also envisioned, as described further subsequently. The aforementioned thickness ratios also apply for the cumulative thicknesses of the respective sub-portions 34, 36.

When using a convention BO ring 30, as illustrated in FIG. 4, the extra mass loading that is provided by the BO ring 30 in the BO region 32 introduces a downward frequency shift in the BO region 32 of the flexural BAW mode. The resulting change in acoustic dispersion between the active region 24 and the BO region 32 is exploited to confine the lateral acoustic energy within the active portion SA of the piezoelectric layer 18. FIG. 9A plots the downshift in frequency vs. the quality factor Qp at optimal BO ring 30 width. The magnitude of the mass loading provided by the BO ring 30 is critical to achieve better Qp.

For the present disclosure, the bi-polar border portion BSB confines the energy of the lateral waves, without a need for significant change in acoustic dispersion from the active portion SA. In FIG. 9A, significantly higher Qp values are achieved with negligible mass loading. Though polarization inversion does not induce changes in mechanical dispersion, the bi-polar border portion BSB does not support several modes due to the electrical boundary conditions. The anti-symmetric modes (in z-direction) in the active portion SA do not propagate into the bi-polar border portion BSB and thus remain confined within the active portion SA.

The active region 24 of BAW resonators resonates at the fundamental series resonance frequency ($f_s$). A novel aspect of the bi-polar border portion BSB is that it does not support the fundamental acoustic tones. Fundamental mode resonances have zero coupling (k2e) in structures where the sub-portions 34, 36 have inverted polarizations. Irrespective of the mass loading added to or by the bi-polar border portion BSB, no modes in vicinity of the series resonance frequency ($f_s$) are excited in the BO region 32. As a result, no modes are generated from the BO region 32 at the frequencies that are critical for a filter made of such BAW resonators 10. FIG. 9B shows that BO modes are effectively suppressed in the BO region 32 when the BO region 32 is designed as a bi-polar border portion BSB. At the fundamental series resonance frequency ($f_s$), since bi-polar BO region 32 does not participate in the electromechanical conversion, the effective piezoelectric coupling may decrease by up to 4% or more.

The bi-polar border portion BSB does support second overtone resonances. These resonances typically occur at frequencies that are greater than two times the fundamental series resonance frequency ($f_s$). Since most BAW resonators 10 operate at frequencies above 1500 MHz, the second overtones from the BO region 32 occur at least thousands of megahertz from the fundamental series resonance frequency ($f_s$). FIG. 9C shows the BO mode content for BAW resonators 10 equipped with a BO ring 30 and a bi-polar border portion BSB, respectively. As illustrated, using the bi-polar border portion BSB solves the issues of BO modes falling within the filter passband and enables better design of BAW filters of any bandwidth. In addition, use of the bi-polar border portion BSB facilitates multiplexing with closely spaced bands, as is often required for duplexers and multiplexers.

Further, use of the bi-polar border portion BSB to define the BO region 32 offers much better lateral (spurious) mode suppression than use of a BO ring 30 alone. FIGS. 10A, 10B and 10C compare the best-case scenarios for both the configurations. The spurious content is shown just below series resonance frequency ($f_s$), between series resonance frequency ($f_s$) to parallel resonance frequency ($f_p$), and just above parallel resonance frequency ($f_p$), respectively, in FIGS. 10A, 10B and 10C. These three frequency regions are of prime importance in shaping the filter passband. Note that the design with the bi-polar border portion BSB performs better than the design with a BO ring 30 in suppressing spurious content in all the three frequency regimes. BAW resonators 10 that incorporate the bi-polar border portion BSB have a potential to allow filters made therefrom to achieve spurious-mode—free passbands.

FIG. 11 illustrates a BAW resonator 10 that incorporates a BO ring 30 over the bi-polar border portion BSB of the BO region 32. FIG. 12 illustrates a BAW resonator 10 that incorporates an inversion layer IL that is thick enough to provide a mass loading within the bi-polar border portion BSB. As such, the inversion layer IL in this embodiment is a thickened structure of one or more layers with the desired mass and provided between the sub-portions 34, 36 within the bi-polar border portion BSB. The inversion layer IL in this embodiment may take the place of and provide the mass loading of a BO ring 30. Further, the inversion layer IL may be provided in conjunction with a BO ring 30 that resides on top of the bi-polar portion BSB.

Any of the foregoing embodiments may be implemented in an FBAR construction, wherein the reflector 14 is essentially replaced with an air gap 38, as illustrated in FIG. 13. The foundation structure for the FBAR embodiment includes the substrate 12 and the air gap 38. As such, the transducer 16 essentially resides on or over the foundation structure. In this embodiment, a BO ring 30 and an inversion layer IL, which may be configured to add additional mass, are provided.

There are many potential alternatives to the embodiments described previously. For example, the sub-portions 34, 36 of the BO region 32 may swap polarizations relative to the above-described embodiments, as illustrated in FIG. 14. As indicated previously, the bi-polar border portion BSB may have more than two sub-portions 34, 36. As illustrated in FIG. 15, the bi-polar border portion BSB is divided into four sub-portions 40, 42, 44, 46, which are separated by three inversion layers IL. The inversion layers IL facilitate the polarization swapping of the piezoelectric material within the bi-polar border portion BSB during the growth or deposition process for the piezoelectric layer 18. Sub-portions 40, 44 have a first polarization, and sub-portions 42, 46 have a second polarization, which is opposite of the first polarization. In this embodiment, the outer portion OS and the active portion SA also have the second polarization; however, all of these polarizations could be swapped. Further, the polarizations of the sub-portions 40, 42, 44, 46 could be swapped. The number and the thicknesses of the sub-portions 40, 42, 44, 46 may vary from one embodiment to another depending on the performance metrics required for the application.

Those skilled in the art will recognize improvements and modifications to the preferred embodiments of the present disclosure. All such improvements and modifications are considered within the scope of the concepts disclosed herein and the claims that follow.

What is claimed is:

1. A piezoelectric device comprising:
 a foundation structure; and
 a transducer over the foundation structure and comprising:
  a bottom electrode;
  a piezoelectric layer over the bottom electrode and comprising a piezoelectric material; and
  a top electrode over the piezoelectric layer, wherein:
   the piezoelectric layer has an active portion within an active region of the transducer, and a bi-polar border portion within a border region of the transducer;
   the piezoelectric material in the active portion has a first polarization;
   the bi-polar border portion comprises a first sub-portion and a second sub-portion that is either over or under the first sub-portion;
   the piezoelectric material in the first sub-portion has the first polarization, and the piezoelectric material in the second sub-portion has a second polarization, which is opposite the first polarization; and an outer portion of the piezoelectric layer has only one of the first polarization and the second polarization.

2. The piezoelectric device of claim 1 further comprising a first inversion layer between the first sub-portion and the second sub-portion.

3. The piezoelectric device of claim 2 wherein the first inversion layer provides mass loading within the border region.

4. The piezoelectric device of claim 3 further comprising a border ring within the border region and over the piezoelectric layer wherein the border ring provides mass loading.

5. The piezoelectric device of claim 1 further comprising a border ring within the border region and over the piezoelectric layer wherein the border ring provides mass loading.

6. The piezoelectric device of claim 1 wherein the piezoelectric material is formed from a compound comprising a metal element and a non-metal element.

7. The piezoelectric device of claim 6 wherein the metal element is a group III element and the non-metal element is a group V element.

8. The piezoelectric device of claim 1 wherein the piezoelectric material comprises aluminum nitride (AlN) doped with a transition metal comprising at least one of scandium, erbium, magnesium, and hafnium.

9. The piezoelectric device of claim 1 wherein the outer portion is within an outside region such that the border region is between the outside region and the active region.

10. The piezoelectric device of claim 1 wherein the piezoelectric material in the outer portion has the first polarization.

11. The piezoelectric device of claim 1 wherein the foundation structure comprises a substrate and a reflector, which comprises a plurality of reflector layers, over the substrate, such that the device is a solidly mounted resonator-based bulk acoustic wave resonator.

12. The piezoelectric device of claim 1 wherein the foundation structure comprises a substrate that provides an air gap below the transducer, such that the device is a film bulk acoustic resonator (FBAR).

13. The piezoelectric device of claim 1 wherein the bi-polar border portion comprises at least two additional sub-portions either over or under the first sub-portion and the second sub-portion, the at least two additional sub-portions alternating between the first polarization and the second polarization.

14. The piezoelectric device of claim 1 wherein a ratio of a thickness of the first sub-portion to a thickness of the second sub-portion is between 0.7:1.0 and 1.3:1.0.

15. A method for forming a piezoelectric device comprising:
providing a foundation structure;
forming a bottom electrode over the foundation structure;
forming a lower portion of a piezoelectric layer over the bottom electrode and through an outside region, a border region, and an active region, wherein the active region is inside of the border region and the border region is inside of the outside region;
within the border region, forming an inversion layer over the lower portion of the piezoelectric layer;
forming an upper portion of the piezoelectric layer over the inversion layer and through the outside region, the border region, and the active region, wherein:
the lower portion of the piezoelectric layer below the inversion layer and within the border region has a first polarization;
the upper portion of the piezoelectric layer over the inversion layer and within the border region has a second polarization, which is opposite that of the first polarization; and
an outer portion of the piezoelectric layer in the outside region has only one of the first polarization and the second polarization; and
forming a top electrode over the upper portion of the piezoelectric layer.

16. The method of claim 15 wherein the active region and the outer portion of the piezoelectric layer have the first polarization.

17. The method of claim 15 wherein the piezoelectric device is a solidly mounted resonator-based bulk acoustic wave resonator or a film bulk acoustic resonator (FBAR).

18. A wireless device comprising,
one or more piezoelectric devices, wherein at least one or more piezoelectric devices comprises:
a foundation structure; and
a transducer over the foundation structure and comprising:
a bottom electrode;
a piezoelectric layer over the bottom electrode and comprising a piezoelectric material; and
a top electrode over the piezoelectric layer, wherein:
the piezoelectric layer has an active portion within an active region of the transducer, and a bi-polar border portion within a border region of the transducer;
the piezoelectric material in the active portion has a first polarization such that the active region is unipolar;
the bi-polar border portion comprises a first sub-portion and a second sub-portion that is either over or under the first sub-portion; and
the piezoelectric material in the first sub-portion has the first polarization, and the piezoelectric material in the second sub-portion has a second polarization, which is opposite the first polarization.

19. The wireless device of claim 18 wherein an outer portion of the piezoelectric layer has only one of the first polarization and the second polarization, and the outer portion is within an outside region such that the border region is between the outside region and the active region.

20. The wireless device of claim 18 wherein the at least one piezoelectric device is a solidly mounted resonator-based bulk acoustic wave resonator or a film bulk acoustic resonator (FBAR).

* * * * *

UNITED STATES PATENT AND TRADEMARK OFFICE
CERTIFICATE OF CORRECTION

| | | |
|---|---|---|
| PATENT NO. | : 11,784,628 B2 | |
| APPLICATION NO. | : 17/933958 | |
| DATED | : October 10, 2023 | |
| INVENTOR(S) | : Jyothi Swaroop Sadhu et al. | |

It is certified that error appears in the above-identified patent and that said Letters Patent is hereby corrected as shown below:

In the Specification

In Column 8, Line 14, replace "ScAIN, YAIN" with --ScAlN, YAlN--.
In Column 8, Line 15, replace "[Mg][Zr]AIN, [Sc][Er]AIN" with --[Mg][Zr]AlN, [Sc][Er]AlN--.

In Column 9, Line 43, replace "AIN" with --AlN--.
In Column 9, Line 45, replace "AIN" with --AlN--.
In Column 9, Line 46, replace "AIN" with --AlN--.
In Column 9, Line 47, replace "AIN" with --AlN--.
In Column 9, Line 52, replace "AIN" with --AlN--.
In Column 9, Line 54, replace "AI-polarity (AI-polar)" with --Al-polarity (Al-polar)--.

In Column 10, Line 24, replace "(AI-polar)" with --(Al-polar)--.
In Column 10, Line 26, replace "AI-polar" with --Al-polar--.
In Column 10, Line 27, replace "AI atom" with --Al atom--.
In Column 10, Line 33, replace "AI atom" with --Al atom--.
In Column 10, Line 35, replace "AI-polar" with --Al-polar--.

Signed and Sealed this
Seventh Day of November, 2023

Katherine Kelly Vidal
*Director of the United States Patent and Trademark Office*